United States Patent
Zeng et al.

(10) Patent No.: US 11,057,693 B2
(45) Date of Patent: Jul. 6, 2021

(54) MICROPHONE

(71) Applicant: AAC Acoustic Technologies (Shenzhen) Co., Ltd., Shenzhen (CN)

(72) Inventors: Peng Zeng, Shenzhen (CN); Tianjiao Wang, Shenzhen (CN)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 0 days.

(21) Appl. No.: 16/703,910

(22) Filed: Dec. 5, 2019

(65) Prior Publication Data

US 2021/0176549 A1    Jun. 10, 2021

(51) Int. Cl.
*H04R 1/08* (2006.01)
*H04R 19/04* (2006.01)
(Continued)

(52) U.S. Cl.
CPC ........... *H04R 1/086* (2013.01); *B81B 7/0058* (2013.01); *H04R 1/04* (2013.01); *H04R 19/005* (2013.01);
(Continued)

(58) Field of Classification Search
CPC ........ H04R 1/086; H04R 1/04; H04R 19/005; H04R 19/04; H04R 2201/003; B81B 7/0058; B81B 2201/0257
See application file for complete search history.

(56) References Cited

U.S. PATENT DOCUMENTS

| | | | |
|---|---|---|---|
| 2007/0007858 A1* | 1/2007 | Sorensen | H04R 1/40 310/324 |
| 2014/0140558 A1* | 5/2014 | Kwong | H04R 3/007 381/345 |

(Continued)

FOREIGN PATENT DOCUMENTS

| | | |
|---|---|---|
| CN | 201114761 B1 | 9/2008 |
| CN | 206602609 B1 | 10/2017 |
| CN | 206602610 B1 | 10/2017 |

OTHER PUBLICATIONS

PCT search report dated Jan. 31, 2020 by SIPO in related PCT Patent Application No. PCT/CN2019/113282 (9 Pages).

*Primary Examiner* — Fan S Tsang
*Assistant Examiner* — Daniel R Sellers
(74) *Attorney, Agent, or Firm* — W&G Law Group LLP

(57) ABSTRACT

A microphone is provided. The microphone includes a shell with an accommodating cavity, as well as a micro-electromechanical system chip and a control circuit chip accommodated in the accommodating cavity, where the shell is provided with a sound hole penetrating through a thickness of the shell and communicated with the accommodating cavity; the microphone further includes an electric anti-dust device at least completely covering the sound hole, the electric anti-dust device is electrically connected with the control circuit chip, and can open the sound hole when receiving a power-on signal of the control circuit chip and close the sound hole when not receiving the power-on signal of the control circuit chip, thus effectively improving a pollution problem of the microphone during such process as transportation, assembly, SMT or unused state that dust is fed most easily without affecting an acoustic performance.

7 Claims, 4 Drawing Sheets

(51) Int. Cl.
  *H04R 19/00* (2006.01)
  *B81B 7/00* (2006.01)
  *H04R 1/04* (2006.01)

(52) U.S. Cl.
  CPC ...... *H04R 19/04* (2013.01); *B81B 2201/0257* (2013.01); *H04R 2201/003* (2013.01)

(56) References Cited

U.S. PATENT DOCUMENTS

| | | | | |
|---|---|---|---|---|
| 2015/0078589 A1* | 3/2015 | Uchida | ............... | H04R 19/04 381/174 |
| 2015/0340795 A1* | 11/2015 | Lee | ............... | H01R 13/447 381/334 |
| 2016/0167948 A1* | 6/2016 | Holliday | ............... | B81C 99/002 428/212 |

* cited by examiner

MICROPHONE

TECHNICAL FIELD

The present disclosure relates to the field of acoustic equipment technologies, and more particularly, to a microphone.

BACKGROUND

Traditionally, in order to enable a microphone to prevent dust, it is often necessary to attach a fixed anti-dust film on a position of a sound hole of the microphone. However, the fixed anti-dust film needs to be provided with an anti-dust hole. Therefore, there is always a certain probability that foreign matters smaller than the anti-dust hole may enter the anti-dust hole. In addition, the biggest disadvantage is that since the sound hole is provided with an anti-dust screen, the damping becomes larger, and the acoustic performance of the microphone becomes worse.

Therefore, it is necessary to research a microphone with a new structure.

BRIEF DESCRIPTION OF THE DRAWINGS

FIG. 1 is a sectional view of a microphone in a first embodiment of the present disclosure when the microphone is not powered on;

FIG. 2 is a sectional view of the microphone in the first embodiment of the present disclosure when the microphone is powered on;

FIG. 3 is a sectional view of a microphone in a second embodiment of the present disclosure when the microphone is not powered on; and FIG. 4 is a sectional view of the microphone in the second embodiment of the present disclosure when the microphone is powered on.

DETAILED DESCRIPTION

The present disclosure is described in detail hereinafter with reference to FIG. 1 to FIG. 4.

First Embodiment

Figure 1:
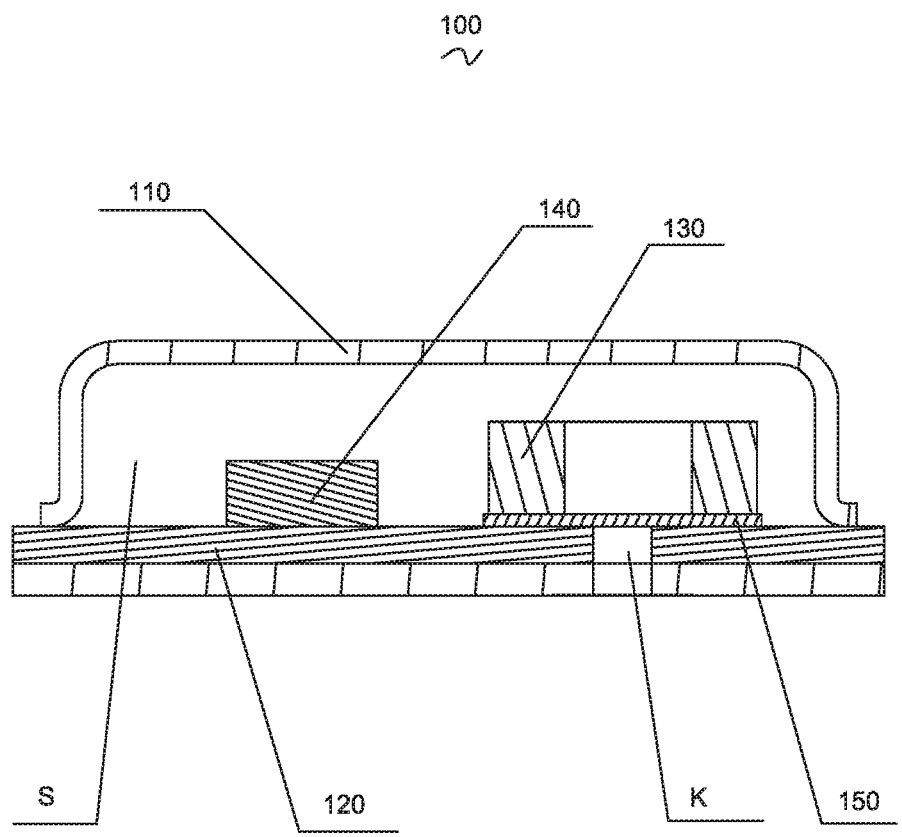
Figure 2:
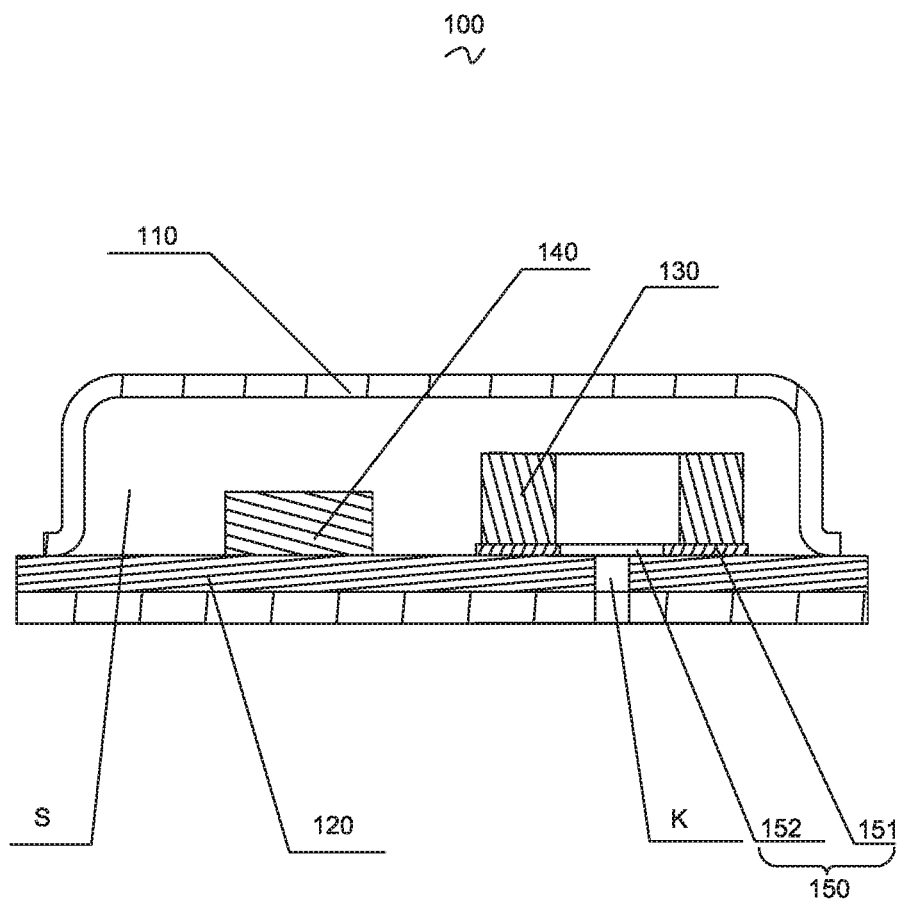

As shown in FIG. 1 and FIG. 2, the present disclosure relates to a microphone 100, which includes an outer shell 110 and a circuit board 120 covered and connected with the outer shell 110 to form an accommodating cavity 5, as well as a micro-electro-mechanical system chip 130 and a control circuit chip 140 accommodated in the accommodating cavity S. and the micro-electro-mechanical system chip 130 and the control circuit chip 140 are both electrically connected with the circuit board 120. The circuit board 120 is provided with a sound hole K penetrating through a thickness of the circuit board 120 and communicated with the accommodating cavity S. The microphone 100 further includes an electric anti-dust device 150 at least completely covering the sound hole K, the electric anti-dust device 150 is electrically connected with the control circuit chip 140, and the electric anti-dust device 150 can open the sound hole K when receiving a power-on signal of the control circuit chip 140 and close the sound hole K when not receiving the power-on signal of the control circuit chip 140.

As shown in FIG. 1 and FIG. 2, the sound hole K can be corresponding to a position of the micro-electro-mechanical system chip 130, and the electric anti-dust device 150 is sandwiched between the circuit board 120 and the micro-electro-mechanical system chip 130. Naturally, in addition, the sound hole K can also be corresponding to a position of the control circuit chip 140, and in this case, the electric anti-dust device 150 is sandwiched between the circuit board 120 and the control circuit chip 140.

Specifically, as shown in FIG. 1, in this case, the control circuit chip 140 does not send the power-on signal, and the electric anti-dust device 150 completely covers the sound hole K, thus realizing an anti-dust function of the microphone. On the contrary, as shown in FIG. 2, when the control circuit chip 140 sends the power-on signal, the electric anti-dust device 150 can open the sound hole K under an action of the power-on signal, so that the sound hole K can be communicated with the outside and the accommodating cavity 5, thus realizing functions of pickup and the like of the microphone.

In addition to a general structure of the microphone 100, the microphone 100 in this embodiment further includes the electric anti-dust device 150 at least covering the sound hole K, the electric anti-dust device 150 is electrically connected with the control circuit chip 140, and the electric anti-dust device 150 can open the sound hole K when receiving the power-on signal of the control circuit chip 140 and close the sound hole K when not receiving the power-on signal of the control circuit chip 140. Therefore, the microphone 100 in this embodiment can effectively improve a pollution problem of the microphone 100 during such process as transportation, assembly, SMT or unused state that dust is fed most easily without affecting an acoustic performance.

It shall be noted that a specific structure of the electric anti-dust device 150 is not limited, as long as the electric anti-dust device 150 can open the sound hole K when receiving the power-on signal (e.g., a high-level signal) and close the sound hole K when not receiving the power-on signal (e.g., a low-level signal).

As shown in FIG. 1 and FIG. 2, the electric anti-dust device 150 may include a fixed anti-dust portion 151 and a movable anti-dust portion 152 detachably connected with the fixed anti-dust portion 151, the fixed anti-dust portion 151 is sandwiched between the micro-electro-mechanical system chip 130 and the circuit board 120, the movable anti-dust portion 152 is electrically connected with the control circuit chip 140, and the movable anti-dust portion 152 opens the sound hole K when receiving the power-on signal and closes the sound hole K when not receiving the power-on signal. That is, in this embodiment, when the electric anti-dust device 150 receives the power-on signal, the electric anti-dust device 150 does not respond to the power-on signal entirely, and only a portion of the electric anti-dust device 150 corresponding to the sound hole K responds to the power-on signal, that is, the movable anti-dust portion 152 responds to the power-on signal to open or close the sound hole K, thus simplifying the structure of the electric anti-dust device 150.

In this embodiment, the electric anti-dust device 150 may be an electric anti-dust device made of a semiconductor material. For example, preferably, the electric anti-dust device 150 is an electric anti-dust device made of silicon; and in addition, the electric anti-dust device 150 may also be made of one of a semiconductor material/polytetrafluoroethylene mixed material or a polytetrafluoroethylene material. Other semiconductor materials or other polymer materials may also be selected, which can be determined according to actual needs.

Second Embodiment

Figure 3:
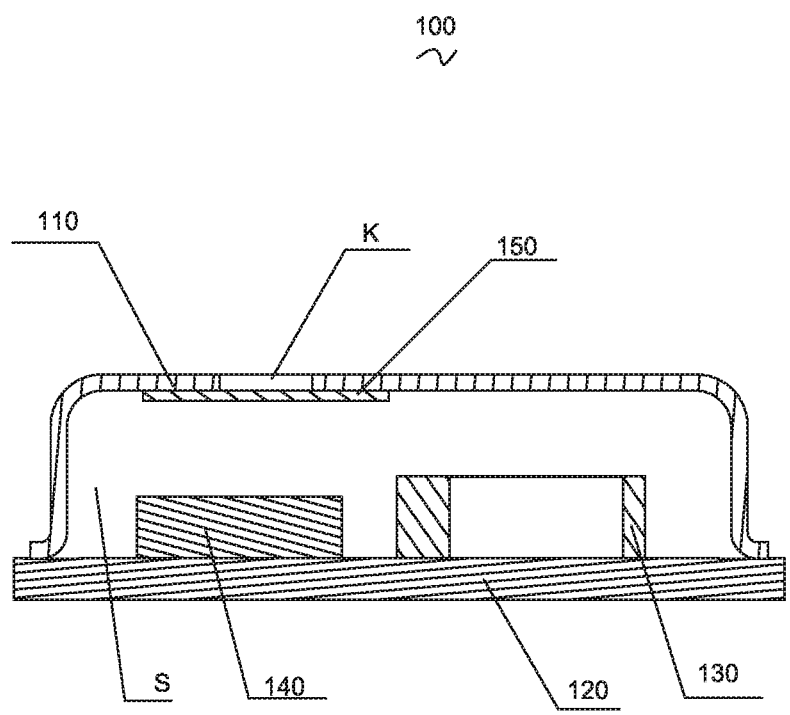
Figure 4:
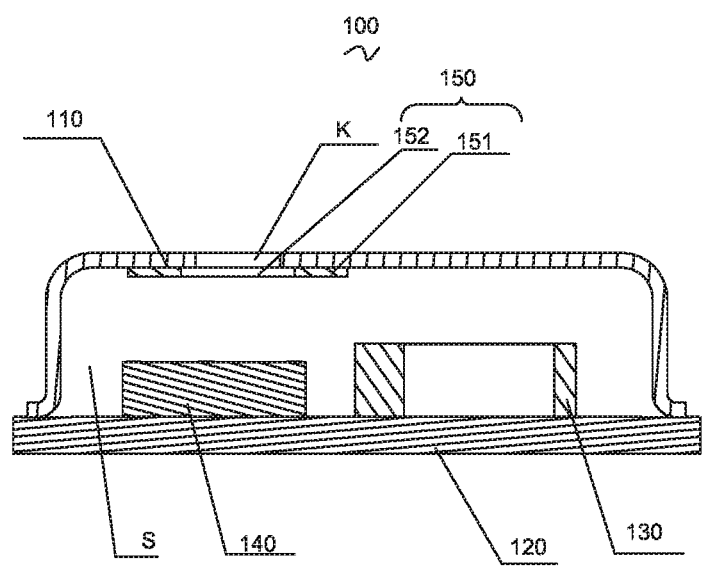

Different from the first embodiment, as shown in FIG. 3 and FIG. 4, a sound hole K is arranged in an outer shell 110, an electric anti-dust device 150 is located between a base wall of the outer shell 110 and a control circuit chip 140. In this case, as shown in FIG. 3, the control circuit chip 140 does not send a power-on signal, and at the moment, the electric anti-dust device 150 completely covers the sound hole K, thus realizing an anti-dust function of a microphone. On the contrary, as shown in FIG. 4, when the control circuit chip 140 sends the power-on signal, the electric anti-dust device 150 can open the sound hole K under an action of the power-on signal, so that the sound hole K can be communicated with the outside and an accommodating cavity S, thus realizing functions of pickup and the like of the microphone.

Other structures in this embodiment may refer to relevant contents recorded in the first embodiment, which are not elaborated here.

The above merely describes embodiments of the present disclosure, and it should be noted that, those of ordinary skills in the art can make improvements without departing from the inventive concept of the present disclosure, but these all belong to the scope of protection of the present disclosure.

What is claimed is:

1. A microphone, comprising a shell with an accommodating cavity, as well as a micro-electro-mechanical system chip and a control circuit chip accommodated in the accommodating cavity, wherein the shell is provided with a sound hole penetrating through a thickness of the shell and communicated with the accommodating cavity;

the microphone further comprises an electric anti-dust device at least completely covering the sound hole, the electric anti-dust device is electrically connected with the control circuit chip; and the electric anti-dust device can open the sound hole when receiving a power-on signal of the control circuit chip and close the sound hole when not receiving the power-on signal of the control circuit chip;

wherein the shell comprises an outer shell and a circuit board covered and connected with the outer shell to form the accommodating cavity;

the micro-electro-mechanical system chip and the control circuit chip are both electrically connected with the circuit board, and the circuit board is provided with the sound hole;

wherein the sound hole is corresponding to a position of the micro-electro-mechanical system chip, and the electric anti-dust device is sandwiched between the circuit board and the micro-electro-mechanical system chip.

2. The microphone according to claim 1, wherein the electric anti-dust device comprises a fixed anti-dust portion and a movable anti-dust portion detachably connected with the fixed anti-dust portion; the movable anti-dust portion is electrically connected with the control circuit chip, and the movable anti-dust portion opens the sound hole when receiving the power-on signal and closes the sound hole when not receiving the power-on signal.

3. The microphone according to claim 1, wherein the electric anti-dust device is made of a semiconductor material.

4. The microphone according to claim 1, wherein the electric anti-dust device is made of one of a semiconductor material/polytetrafluoroethylene mixed material or a polytetrafluoroethylene material.

5. The microphone according to claim 4, wherein the electric anti-dust device is an electric anti-dust device made of silicon.

6. A microphone, comprising a shell with an accommodating cavity, as well as a micro-electro-mechanical system chip and a control circuit chip accommodated in the accommodating cavity, wherein the shell is provided with a sound hole penetrating through a thickness of the shell and communicated with the accommodating cavity;

the microphone further comprises an electric anti-dust device at least completely covering the sound hole, the electric anti-dust device is electrically connected with the control circuit chip; and the electric anti-dust device can open the sound hole when receiving a power-on signal of the control circuit chip and close the sound hole when not receiving the power-on signal of the control circuit chip;

wherein the shell comprises an outer shell and a circuit board covered and connected with the outer shell to form the accommodating cavity, the micro-electro-mechanical system chip and the control circuit chip are both electrically connected with the circuit board, and the outer shell is provided with the sound hole;

wherein the sound hole is corresponding to a position of the control circuit chip, and the electric anti-dust device is located between a base wall of the outer shell and the control circuit chip.

7. The microphone according to claim 6, wherein the electric anti-dust device comprises a fixed anti-dust portion and a movable anti-dust portion detachably connected with the fixed anti-dust portion; the movable anti-dust portion is electrically connected with the control circuit chip, and the movable anti-dust portion opens the sound hole when receiving the power-on signal and closes the sound hole when not receiving the power-on signal.

* * * * *